United States Patent
Maloney et al.

(10) Patent No.: US 7,750,629 B2
(45) Date of Patent: Jul. 6, 2010

(54) MEASURING ELECTRIC AND MAGNETIC FIELD

(75) Inventors: Timothy J. Maloney, Palo Alto, CA (US); Andy Martwick, Portland, OR (US); Kai Wang, Hillsboro, OR (US)

(73) Assignee: Intel Corporation, Santa Clara, CA (US)

( * ) Notice: Subject to any disclaimer, the term of this patent is extended or adjusted under 35 U.S.C. 154(b) by 302 days.

(21) Appl. No.: 11/848,142

(22) Filed: Aug. 30, 2007

(65) Prior Publication Data

US 2009/0058414 A1    Mar. 5, 2009

(51) Int. Cl.
*G01R 23/04*   (2006.01)
*G01R 29/10*   (2006.01)
(52) U.S. Cl. .................... 324/263; 324/95; 343/703
(58) Field of Classification Search .............. 324/263, 324/95, 258, 637; 343/703; 342/362
See application file for complete search history.

(56) References Cited

U.S. PATENT DOCUMENTS

| | | | | |
|---|---|---|---|---|
| 5,231,346 A | * | 7/1993 | Gassmann | 324/95 |
| 5,773,974 A | * | 6/1998 | Kraz | 324/258 |
| 6,844,725 B2 | * | 1/2005 | Hoshino | 324/226 |
| 6,975,111 B2 | * | 12/2005 | Kazama et al. | 324/260 |

* cited by examiner

*Primary Examiner*—Timothy J Dole
*Assistant Examiner*—Farhana Hoque
(74) *Attorney, Agent, or Firm*—Blakely, Sokoloff, Taylor & Zafman LLP

(57) ABSTRACT

A field detection device such as a micro-strip portion of a transmission line may detect an electric field and a magnetic field induced by current steps injected into the chassis coupled to a ground plane. The shield portions of the transmission line may be coupled to a first and a second port of an I/O connector. A measurement system coupled to the connector may determine the electric field and the magnetic field detected by the micro-strip. The measurement system may determine the electric field and magnetic field based on computing the sum and difference of the signals provided by the first port and the second port.

18 Claims, 2 Drawing Sheets

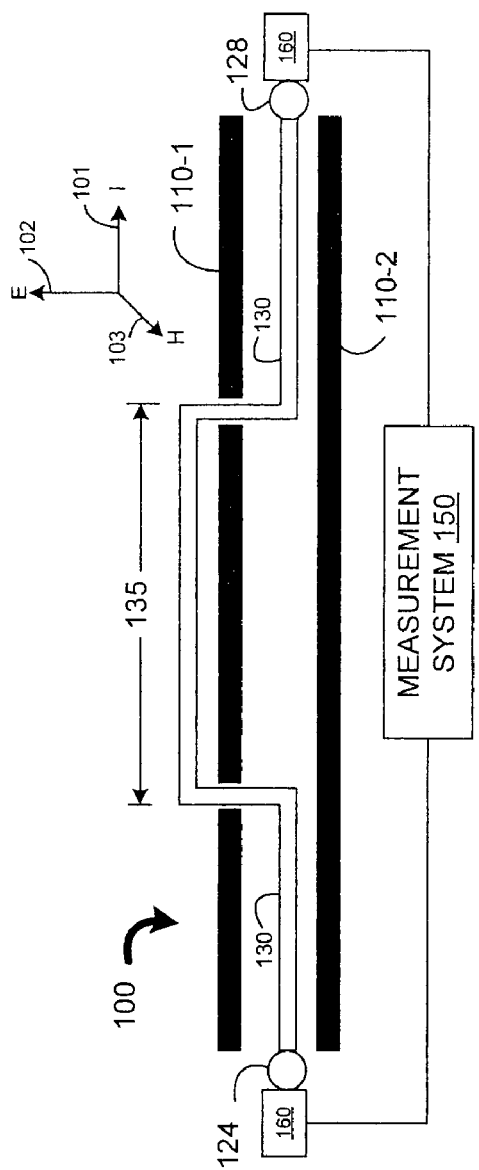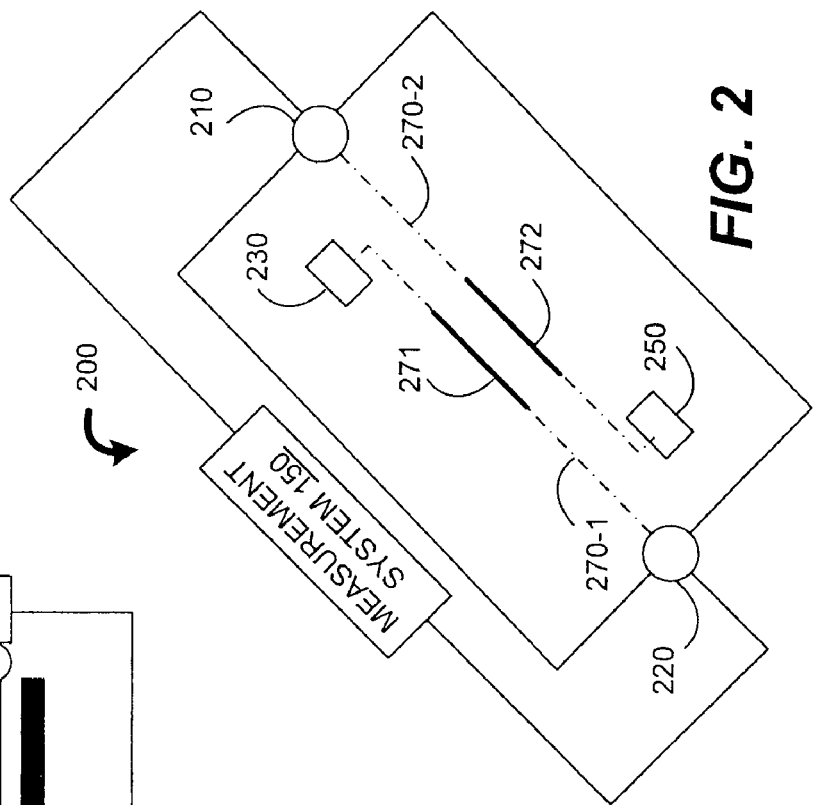

MEASURING ELECTRIC AND MAGNETIC FIELD

BACKGROUND

Current flowing through a conductor generates electric and magnetic field. For example, a printed circuit board (PCB) may comprise several conductors and an electronic system such as computer system may comprise PCB's such as a mother board. Such printed circuit boards are typically enclosed in a chassis. While measuring electric (E) and magnetic field (H) generated by the conductors of a PCB enclosed in a chassis, the chassis may be opened up and small probes such as coupling loops may be used. Opening up the chassis creates changes in the electric and magnetic field and may not provide accurate measure of E and H fields. Also, closing up the chassis and inserting probes to measure E and H fields may not provide an elegant approach to measure E and H fields.

BRIEF DESCRIPTION OF THE DRAWINGS

The invention described herein is illustrated by way of example and not by way of limitation in the accompanying figures. For simplicity and clarity of illustration, elements illustrated in the figures are not necessarily drawn to scale. For example, the dimensions of some elements may be exaggerated relative to other elements for clarity. Further, where considered appropriate, reference labels have been repeated among the figures to indicate corresponding or analogous elements.

FIG. 1 illustrates an embodiment of a field detection device 100 used to measure E and H fields.

FIG. 2 illustrates an embodiment of a field detection device 200 used to measure E and H fields.

DETAILED DESCRIPTION

Figure 3:
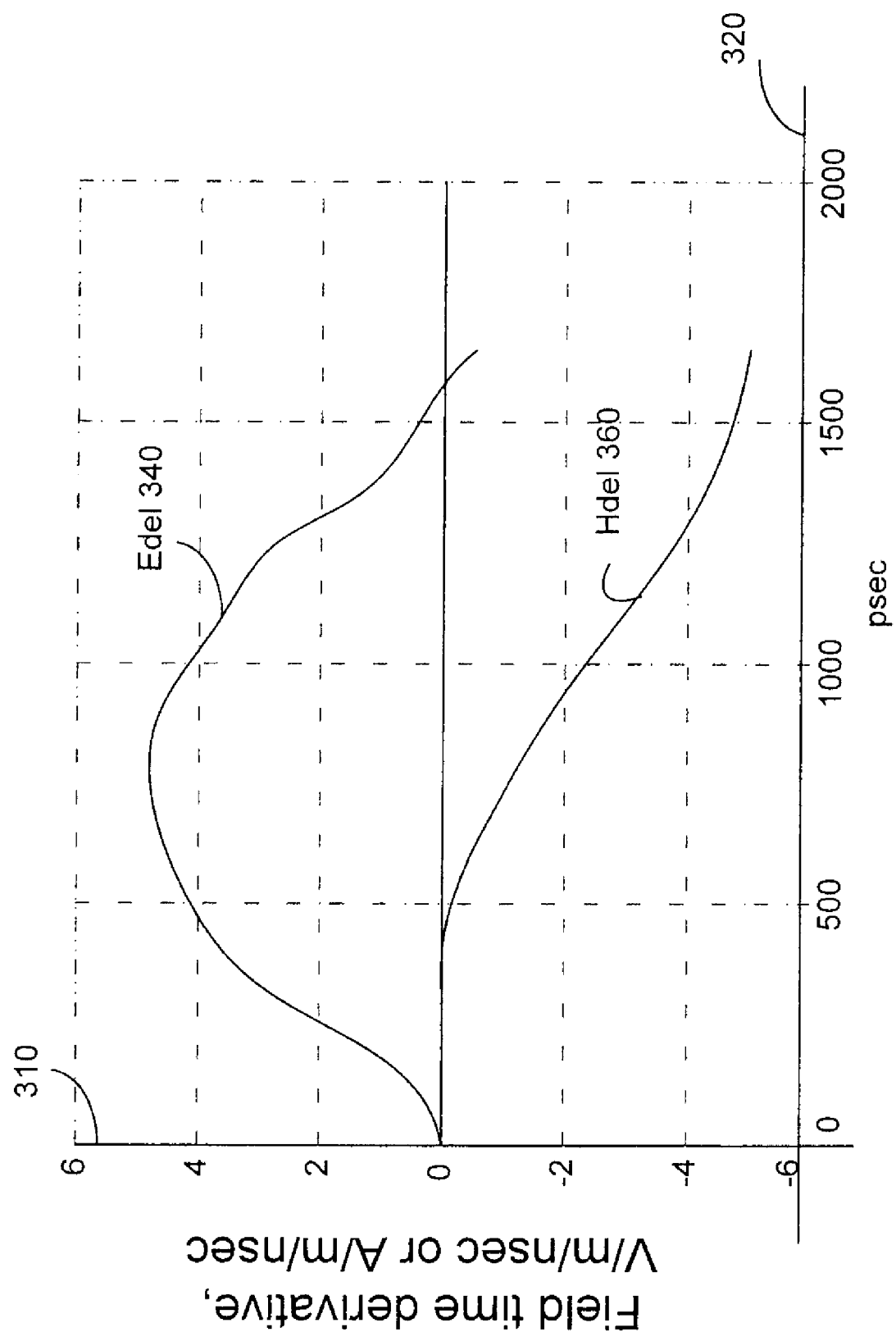
FIG. 3 illustrates waveforms that depict the measurement of E and H field.

The following description describes a probe for measuring electric (E) and magnetic (H) field. In the following description, numerous specific details such as logic implementations, resource partitioning, or sharing, or duplication implementations, types and interrelationships of system components, and logic partitioning or integration choices are set forth in order to provide a more thorough understanding of the present invention. It will be appreciated, however, by one skilled in the art that the invention may be practiced without such specific details. In other instances, control structures, gate level circuits, and full software instruction sequences have not been shown in detail in order not to obscure the invention. Those of ordinary skill in the art, with the included descriptions, will be able to implement appropriate functionality without undue experimentation.

References in the specification to "one embodiment", "an embodiment", "an example embodiment", indicate that the embodiment described may include a particular feature, structure, or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

Embodiments of the invention may be implemented in hardware, firmware, software, or any combination thereof. Embodiments of the invention may also be implemented as instructions stored on a machine-readable medium, which may be read and executed by one or more processors. A machine-readable medium may include any mechanism for storing or transmitting information in a form readable by a machine (e.g., a computing device).

For example, a machine-readable medium may include read only memory (ROM); random access memory (RAM); magnetic disk storage media; optical storage media; flash memory devices; electrical, optical, acoustical or other forms of propagated signals (e.g., carrier waves, infrared signals, and digital signals). Further, firmware, software, routines, and instructions may be described herein as performing certain actions. However, it should be appreciated that such descriptions are merely for convenience and that such actions in fact result from computing devices, processors, controllers, and other devices executing the firmware, software, routines, and instructions.

An embodiment of a field detection device 100 is illustrated in FIG. 1. In one embodiment, the field detection device 100 may be used during electromagnetic compatibility and electro-static discharge (EMC-ESD) testing such as tests conducted by injecting high current pulses into grounded chassis metal conductors. In one embodiment, the field detection device 100 may comprise a shielded strip-line 130, micro-strip 135, ac ground plane 110-1 and 110-2, ports 124 and 128, a connector 160, and a measurement system 150.

In one embodiment, the measurement system 150 may comprise an oscilloscope and a signal combiner, which may have the capability to perform operations such as addition and subtraction of signals. In one embodiment, the measurement system 150 may receive signals from the ports 124 and 128 and may use the signal values to determine the electric (E) and magnetic field (H). In one embodiment, the E and H fields may be determined by computing their time derivatives. In one embodiment, the ports 210 and 220 may be coupled to the measurement system 150, which may determine the change in electric field $\Delta E$ or $E_{del}$ and the change in magnetic field $\Delta H$ or $H_{del}$ over a short time period $\Delta t$ or $t_{del}$. In one embodiment, the measurement system 150 may display $E_{del}$ and $H_{del}$ values in a readable form.

In one embodiment, a transmission line may comprise the shielded strip-line 130 provisioned between the ac ground planes 110-1 and 110-2 and the micro-strip portion 135. In one embodiment, the strip-line 130 may comprise two portions 130-1 and 130-2, which are impedance matched and provisioned on each side of the micro-strip 135 as depicted. In one embodiment, the strip-line portion 130-1 and 130-2 may be, respectively, coupled to the ports 124 and 128.

In one embodiment, the ports 124 and 128 may be coupled to unused pins of an I/O connector such as the mini-DIN 6-pin connector used for coupling a mouse or a universal serial bus (USB) keyboard device to the mother board. In one embodiment, the ports 124 and 128 may be coupled to unused pins 2 and 6 of the mini-DIN 6-pin connector. In one embodiment, the unused pins of the VGA connector may also be used to couple the micro-strip 135 to the ports 124 and 128. In one embodiment, the ports 124 and 128 may be coupled to the measurement system 150 through the unused pins of the connector 160. Utilizing unused pins of the connector such as the mini-DIN 6-pin connector or the USB based key board connector may allow EMC-ESD testing to be performed without interrupting the operation of an electronic system of which the field detection device is a part.

In one embodiment, a portion 135 of the transmission line may be arranged to be above the ground plane and such a portion may be referred to as the micro-strip 135. In one embodiment, the micro-strip 135 may be a thin, flat electrical conductor separated from the ground plane 110-1 by a dielectric. In one embodiment, the length of the micro-strip 135 may equal 'l' and the height or thickness of the micro-strip 135 may equal 'h' and the width of the micro-strip 135 may equal 'w'. In one embodiment, the micro-strip 135 may transition to impedance matched strip-line portions 130-1 and 130-2 at each end. In other embodiment, the micro-strip 135 may be an air-line dielectric medium.

In one embodiment, a current (I) flowing into the chassis coupled to the ac ground plane 110-1 and 110-2 may generate an electric field (F) in a direction 102, which is perpendicular to the direction 101. Also, due to flow of current 'I' into the chassis coupled to ground plane 110-1 and 110-2, a magnetic field (H) may be generated in a direction 103, which is perpendicular to both the directions 101 and 102. In one embodiment, the current 'I' may be applied in the form of pulses of short duration. In one embodiment, the E and H fields caused due to application of current pulses may cause backward and forward waves on the micro-strip 135.

In one embodiment, the net charge accumulation on the micro-strip 135 before and after a step in the magnetic field H generated by the current pulse is zero and a non-zero net charge may be caused only due to the electric field E. In one embodiment, the sum of the charges measured from the ports 124 and 128 may represent the E field and the difference of the charges measured from the ports 124 and 128 may represent the H field. In one embodiment, a value of E and H field may be determined by integrating the E and H field values generated by each current step.

In one embodiment, the micro-strip 135 may be used to detect the fields E and H by measuring charge packets over pre-specified intervals of time '$t_{del}$'. In one embodiment, the measurement of charge packets may be performed by integrating current pulses at the ports 124 and 128 over the pre-specified intervals of time '$t_{del}$'. In one embodiment, the change in the electric field '$E_{del}$' and the change in the magnetic field '$H_{del}$' over the time periods '$t_{del}$' may be computed based on the measurement of charge packets. In one embodiment, the measurement of $E_{del}$ may be described using "Gauss' Law" and $H_{del}$ may be described using the Faraday-Lenz law.

From "Gauss' Law", the charge $Q_{sum}$ on the micro-strip 135 due to the electric field E may be given by Equation (1) below. In one embodiment, $Q_{sum}$ is measured as a sum of the two channels provided by the ports 124 and 128.

$$Q_{sum} = (\epsilon_0 * E * l * w) \qquad \text{Equation (1)}$$

wherein '$\epsilon_0$' is the permittivity in free space and is equal to $8.854 \times 10^{-12}$ Farad/meter; 'E' is the electric field in volts/meter; 'l' is the length of the micro-strip 135 in meters and 'w' is the width of the micro-strip 135 in meters. For simplicity, metal thickness may be presumed to be negligible and effect due to the dielectric constant of the PCB is not considered.

The change in the electric field '$E_{del-1}$' due to a first current step causing flow of charge through the ports 124 and 128 during $t_{del-1}$ is given by Equation (2) below.

$$E_{del-1} = Q_{sum}/(\epsilon_0 * l * w) \text{volts/meter} \qquad \text{Equation (2)}$$

In one embodiment, the electric field E is given by Equation (3) below.

$$E = \text{integration}(E_{del-1}, E_{del-2}, E_{del-3}, \ldots E_{del-N}) \qquad \text{Equation (3)}$$

wherein $E_{del-2}, E_{del-3} \ldots E_{del-N}$ represent the electric field steps determined during time intervals $t_{del-2}, t_{del-3}, \ldots t_{del-N}$ in response to application of a second, third, $\ldots$ $N^{th}$ current step.

By Faraday's law, $V = d\Phi/dt$, wherein '$\Phi$' is the flux and V is the voltage. The flux '$\Phi$'=(B*l*h), wherein B is the magnetic induction in webers/square meter. The magnetic induction 'B'=($\mu_0$*H), wherein '$\mu_0$' is the magnetic permeability, which equals $4\pi \times 10^{-7}$ henry/meter and 'H' is the magnetic field in amperes/meter.

Also, the flux '$\Phi$' on the micro-strip 135 of impedance $Z_0$ matched by resistive terminations of impedance $Z_0$ is given by Equation (4) below.

$$\Phi = (L*I) = (V*t_{del}) = (l*Z_0*t_{del}) = (Q_{diff}*Z_0) = (\mu_0*H*l*h) \qquad \text{Equation (4)},$$

wherein 'L' is the inductance of the micro-strip 135.

The $Q_{diff}$ is measured as a difference of the two channels because of the nature of Faraday's law and Lenz's law as the effect is to induce a current in a particular direction, which is opposite to the direction of H-field flux and to do so without inducing a net amount of charge. For simplicity, the minus sign associated with the Lenz's law is neglected. In one embodiment, the differential charge packet $Q_{diff}$ may be measured over a time period '$t_{del}$', which is the change in the magnetic field '$H_{del}$'.

The change in the magnetic field '$H_{del-1}$' due to a first current step causing flow of charge through the ports 124 and 128 during $t_{del-1}$ is given by Equation (5) below.

$$H_{del} = Q_{diff}*Z_0/(\mu_0*l*h) \text{amperes/meter} \qquad \text{Equation (5)}$$

In one embodiment, the magnetic field H is given by Equation (6) below.

$$H = \text{integration}(H_{del-1}, H_{del-2}, H_{del-3}, \ldots H_{del-N}) \qquad \text{Equation (6)}$$

wherein $H_{del-2}, H_{del-3} \ldots H_{del-N}$ represent the magnetic field steps determined during time intervals $t_{del-2}, t_{del-3}, \ldots t_{del-N}$ in response to application of a second, third, $\ldots$ $N^{th}$ current step.

An embodiment of a field detection device 200 used to determine electric and magnetic field is depicted in FIG. 2. In one embodiment, the field detection device may comprise ports 210 and 220, chip input destinations 230 and 250, and input-output (I/O) lines 270-1 and 270-2.

In one embodiment, the I/O lines 270-1 and 270-2 may, respectively, comprise micro-strips 271 and 272, which may be equal in length and arranged side by side. However, the current through the micro-strips 271 and 272 as detected through the ports 210 and 220, may be different.

In one embodiment, one end of the I/O line 270-1 and 270-2 may be, respectively, routed to the chip input destinations 230 and 250. In one embodiment, the chip input destination 230 and 250 may comprise matched termination impedances. In one embodiment, the portion 270-1 or the strip-line portion may be shielded and coupled to the port 220. In one embodiment, the portion 270-2 or the strip-line portion may be shielded and coupled to the port 210. The ports 210 and 220 may be coupled to the measurement system 150, which may determine the $E_{del}$ and $H_{del}$ and display the $E_{del}$ and $H_{del}$ values in a readable form.

An embodiment of a waveform of the fields $E_{del}$ and $H_{del}$ displayed by the measurement system 150 is depicted in FIG. 3. In one embodiment, the X-axis 320 represents a time scale and the Y-axis 310 represents a field time derivative (volts per meter per nanosecond for $E_{del}$ and amperes per meter per nanosecond for $H_{del}$) scale. In one embodiment, waveform $E_{del}$ 340 depicts the signal trace of change in electric field (E) over a time period 0-1700 pico-seconds. In one embodiment, the H$_{del}$ 360 depicts the signal trace of change in magnetic field (H) over a time period 0-1700 pico-seconds.

Certain features of the invention have been described with reference to example embodiments. However, the description is not intended to be construed in a limiting sense. Various modifications of the example embodiments, as well as other embodiments of the invention, which are apparent to persons skilled in the art to which the invention pertains are deemed to lie within the spirit and scope of the invention.

What is claimed is:

1. An apparatus comprising:
   a ground plane coupled to a chassis,
   a transmission line comprising a first and a second shielded line shielded by the ground plane, wherein a first end of the first shielded line is coupled to a first port and a first end of the second shielded line is coupled to a second port of a connector,
   a micro-strip coupled to a second end of the first and the second shielded line, wherein the micro-strip is to detect an electric field and a magnetic field induced by current steps injected into the chassis, and
   a measurement system coupled to the connector, wherein the measurement system is to determine the electric field and the magnetic field detected by the micro-strip,
   wherein a plurality of changes in the electric field is caused by a current step flowing through the chassis over a short time period.

2. The apparatus of claim 1, wherein the measurement system is to determine the electric field detected by the micro-strip as a sum of the plurality of changes in the electric field.

3. The apparatus of claim 2, wherein the measurement system is to determine each of the plurality of change in the electric field using the charge accumulated on the micro-strip.

4. The apparatus of claim 2, wherein the measurement system is to determine the charge accumulated on the micro-strip as a sum of a first signal and a second signal received from the first port and the second port.

5. The apparatus of claim 4, wherein the first port and the second port is to represent a first pin and a second pin of an input-output connector.

6. The apparatus of claim 1, wherein the measurement system is to determine the magnetic field as a sum of a plurality of changes in the magnetic field.

7. The apparatus of claim 6, wherein each of the plurality of changes in the magnetic field is caused by a current step flowing through the chassis over a short time period.

8. The apparatus of claim 7, wherein each of the plurality of change in the magnetic field is determined based on the difference of a first signal and a second signal received from the first port and the second port.

9. The apparatus of claim 1, wherein the micro-strip comprises an air-line dielectric medium.

10. An apparatus comprising:
    a first transmission line comprising a first micro-strip and a first shielded line, wherein a first end of the first transmission line is coupled to a first port and a second end of the first transmission line is coupled to a first termination impedance,
    a second transmission line comprising a second micro-strip and a second shielded line, wherein a first end of the second transmission line is coupled to a second termination impedance and a second end of the second transmission line is coupled to a second port, and
    a measurement system coupled to a first port and a second port, wherein the measurement system is to determine the electric field and the magnetic field detected by the first and the second micro-strip,
    wherein a plurality of changes in the magnetic field is caused by a current step flowing through the chassis over a short time period.

11. The apparatus of claim 10, wherein the measurement system is to determine the electric field detected by the first and the second micro-strip as a sum of a plurality of changes in the electric field.

12. The apparatus of claim 11, wherein the measurement system is to determine the charge accumulated on the first and the second micro-strip as a sum of a first signal and a second signal received from the first port and the second port.

13. The apparatus of claim 10, wherein the measurement system is to determine the magnetic field as a sum of a plurality of changes in the magnetic field detected by the first and the second micro-strip.

14. The apparatus of claim 13, wherein each of the plurality of changes in the magnetic field is determined based on the difference of a first signal and a second signal received from the first port and the second port.

15. A method comprising:
    shielding a first and a second portion of a transmission line,
    coupling a first end of the first portion of the transmission line to a first port and a first end of the second portion of the transmission line to a second port of a connector,
    coupling a micro-strip to a second end of the first portion and the second portion of the transmission line, wherein the micro-strip is to detect an electric field and a magnetic field induced by current steps injected into the chassis, and
    determining the electric field and the magnetic field detected by the micro-strip using a measurement system coupled to the connector,
    wherein a plurality of changes in the electric field is caused by a current step flowing through the chassis over a short time period.

16. The method of claim 15 further comprises computing a sum of a plurality of changes in the electric field, wherein charge accumulated on the micro-strip equals a sum of a first signal and a second signal received on the first port and the second port.

17. The method of claim 15 further comprises computing a sum of a plurality of changes in the magnetic field, wherein each of the plurality of changes in the magnetic field is determined based on the difference of a first signal and a second signal received from the first port and the second port.

18. The method of claim 15, wherein the connector comprises a mouse connector and the first port and the second port is coupled to unused pins of the mouse connector.

* * * * *